United States Patent
Mace et al.

(10) Patent No.: US 8,125,365 B2
(45) Date of Patent: Feb. 28, 2012

(54) METHOD FOR GENERATING AN ANALOG SIGNAL GENERATED BY PWM SIGNAL, AND SYSTEM GENERATING SUCH SIGNAL

(75) Inventors: Philippe Mace, Rennes (FR); Xavier Guitton, Chasne sur Illet (FR); Philippe Benezeth, Cesson Sevigne (FR)

(73) Assignee: Thomson Licensing, Issy-les-Moulineaux (FR)

( * ) Notice: Subject to any disclaimer, the term of this patent is extended or adjusted under 35 U.S.C. 154(b) by 0 days.

(21) Appl. No.: 12/736,377

(22) PCT Filed: Apr. 9, 2009

(86) PCT No.: PCT/EP2009/002642
§ 371 (c)(1),
(2), (4) Date: Oct. 2, 2010

(87) PCT Pub. No.: WO2009/127361
PCT Pub. Date: Oct. 22, 2009

(65) Prior Publication Data
US 2011/0025535 A1    Feb. 3, 2011

(30) Foreign Application Priority Data
Apr. 14, 2008 (FR) .................................. 08 52498

(51) Int. Cl.
*H03M 1/82* (2006.01)
(52) U.S. Cl. .................... 341/152; 341/144; 341/143

(58) Field of Classification Search ............. 341/143, 341/144, 152
See application file for complete search history.

(56) References Cited

U.S. PATENT DOCUMENTS
5,481,560 A * 1/1996 Potetz et al. .................. 375/238
(Continued)

FOREIGN PATENT DOCUMENTS
EP    1575171    9/2005

OTHER PUBLICATIONS
Search Rept:Jun. 2, 2009.

*Primary Examiner* — Jean Jeanglaude
(74) *Attorney, Agent, or Firm* — Myers Wolin, LLC

(57) ABSTRACT

A generation method of an analogue signal generated by a PWM signal whose cyclic ratio and period are parametrizable is discussed. It is thus possible choose the pair formed from the cyclic ratio and the period producing an analogue value that is the closest to the value corresponding to the programmed command value. But the differences between the analogue values can be very great and generate zones of imprecision of variable width. Outside of these zones, the generated analogue signal is very precise. Therefore, when the command value associated with a pair is imprecise, a digital shift is applied to the command value at the same time as the application of an analogue shift means. Both shifts have the same amplitude and of opposite directions such that the cancel each other out, producing a precise analogue value. A device for generating an analogue signal implementing the method is also discussed.

16 Claims, 4 Drawing Sheets

U.S. PATENT DOCUMENTS

Figure 2:
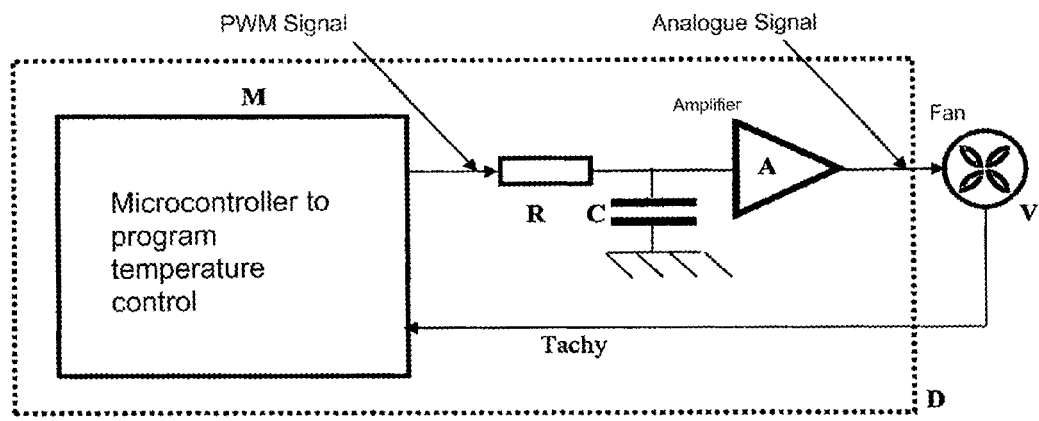

| | | | |
|---|---|---|---|
| 6,181,266 B1 * | 1/2001 | Toki | 341/152 |
| 6,593,864 B1 | 7/2003 | Reilly | |
| 7,498,786 B2 * | 3/2009 | Prinz et al. | 323/283 |
| 7,512,636 B2 * | 3/2009 | Verma et al. | 1/1 |
| 7,619,467 B2 * | 11/2009 | Christian | 330/10 |
| 2005/0110668 A1 | 5/2005 | Chin | |

* cited by examiner

| Dec Index | Hex Index | (PER, T_ON) | Decimal Value |
|---|---|---|---|
| 32897: | 0x8081 | (255, 128) | 0.501960784313725 |
| 32898: | 0x8082 | (253, 127) | 0.501976284584980 |
| 32899: | 0x8083 | (251, 126) | 0.501992031872510 |
| 32900: | 0x8084 | (249, 125) | 0.502008032128514 |
| 32901: | 0x8085 | (247, 124) | 0.502024291497976 |
| 32902: | 0x8086 | (245, 123) | 0.502040816326531 |
| 32903: | 0x8087 | (243, 122) | 0.502057613168724 |
| 32904: | 0x8088 | (241, 121) | 0.502074688796680 |
| 32905: | 0x8089 | (239, 120) | 0.502092050209205 |
| 32906: | 0x808a | (237, 119) | 0.502109704641350 |
| 32907: | 0x808b | (235, 118) | 0.502127659574468 |
| 32908: | 0x808c | (235, 118) | 0.502127659574468 |
| 32909: | 0x808d | (233, 117) | 0.502145922746781 |
| 32910: | 0x808e | (231, 116) | 0.502164502164502 |
| 32911: | 0x808f | (229, 115) | 0.502183406113537 |
| 32912: | 0x8090 | (227, 114) | 0.502202643171806 |
| 32913: | 0x8091 | (227, 114) | 0.502202643171806 |
| 32914: | 0x8092 | (225, 113) | 0.502222222222222 |
| 32915: | 0x8093 | (223, 112) | 0.502242152466368 |
| 32916: | 0x8094 | (221, 111) | 0.502262443438914 |
| 32917: | 0x8095 | (221, 111) | 0.502262443438914 |
| 32918: | 0x8096 | (219, 110) | 0.502283105022831 |
| 32919: | 0x8097 | (217, 109) | 0.502304147465438 |
| 32920: | 0x8098 | (215, 108) | 0.502325581395349 |
| 32921: | 0x8099 | (215, 108) | 0.502325581395349 |
| 32922: | 0x809a | (213, 107) | 0.502347417840376 |
| 32923: | 0x809b | (211, 106) | 0.502369668246445 |
| 32924: | 0x809c | (211, 106) | 0.502369668246445 |
| 32925: | 0x809d | (209, 105) | 0.502392344497608 |
| 32926: | 0x809e | (207, 104) | 0.502415458937198 |
| 32927: | 0x809f | (207, 104) | 0.502415458937198 |
| 32928: | 0x80a0 | (205, 103) | 0.502439024390244 |
| 32929: | 0x80a1 | (203, 102) | 0.502463054187192 |
| 32930: | 0x80a2 | (203, 102) | 0.502463054187192 |
| 32931: | 0x80a3 | (201, 101) | 0.502487562189055 |
| 32932: | 0x80a4 | (201, 101) | 0.502487562189055 |
| 32933: | 0x80a5 | (199, 100) | 0.502512562814070 |

Fig. 3

Fig. 4
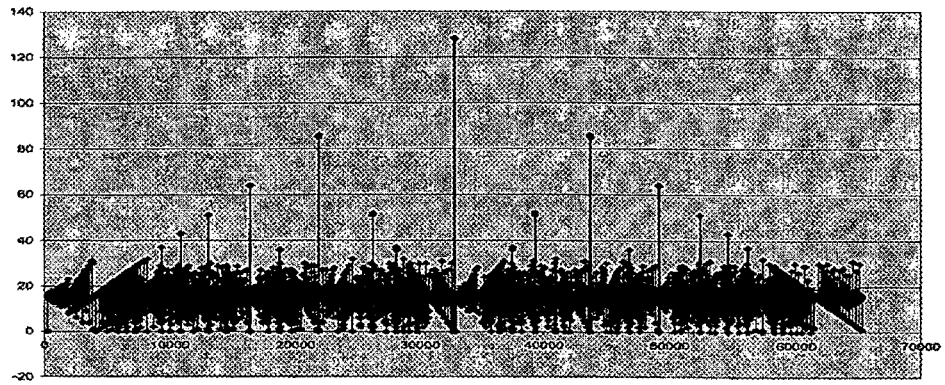
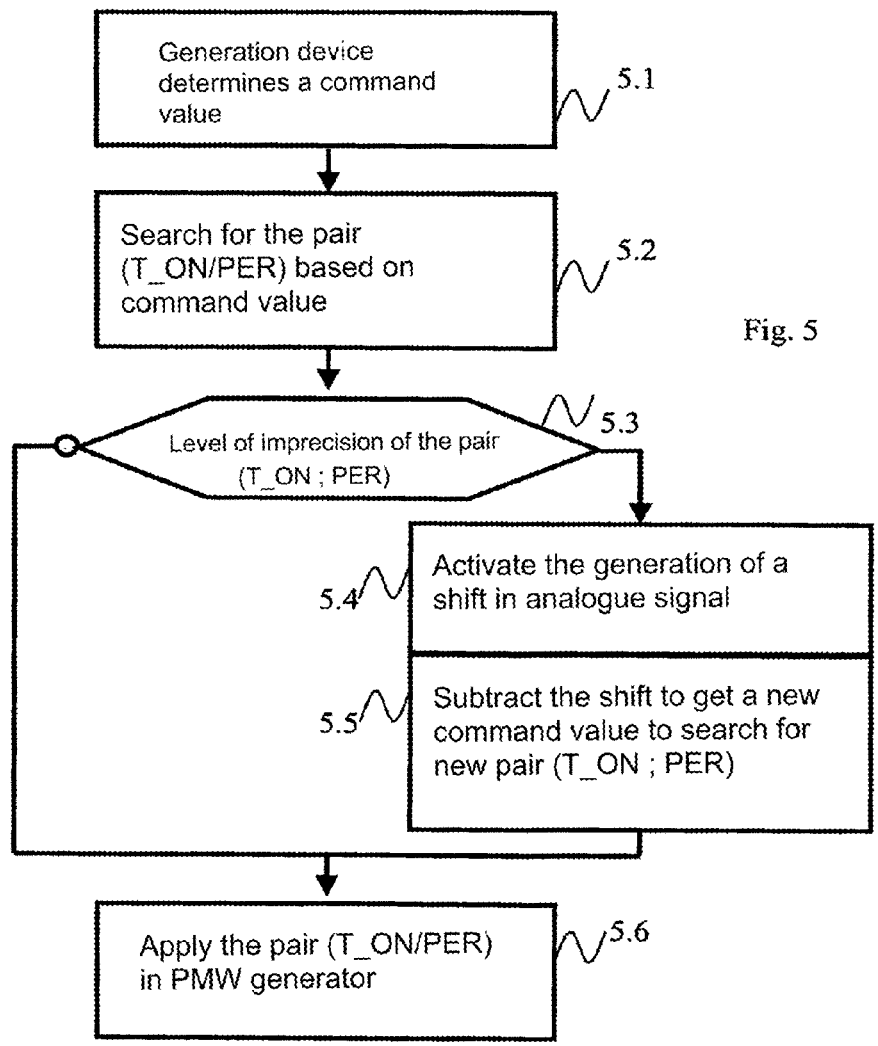
Fig. 5

METHOD FOR GENERATING AN ANALOG SIGNAL GENERATED BY PWM SIGNAL, AND SYSTEM GENERATING SUCH SIGNAL

This application claims the benefit, under 35 U.S.C. §365 of International Application PCT/EP2009/002642 filed Apr. 9, 2009, which was published in accordance with PCT Article 21(2) on Oct. 22, 2009 in French and which claims the benefit of French patent application Ser. No. 08/52498, filed Apr. 14, 2008.

The present invention relates to a method for generating an analogue signal generated from a PWM signal, and a system generating such a signal.

In the domain of the electrical process control, it is necessary to produce analogue signals from digital data. A simple means consists in using a Digital Analogue Converter (DAC). A Central Processing Unit (CPU) controls the converter by introducing a digital value of determined precision into an input register. The analogue precision is all the greater as the control digital value in bits of the DAC increases. DACs with 16 bit registers are commonly found commercially available, the central processing unit is able to introduce 65536 different values for a voltage varying from 0 volts to 10 volts, and a 16 bit DAC generates two consecutive values with a difference of 0.15 millivolts, that is to say a precision of 0.0015%.

The price of the Digital Analogue Converters increases as the precision is increased and the conversion time is more rapid. If a rapid conversion time is not required, the Pulse Width Modulator (PWM) signals enable supply of an analogue voltage from a digital magnitude. A PWM signal is a digital signal comprising two states "0" and "1", this signal is periodic and produced by division of a base clock. During a period, the time duration during which the signal is at 1 is adjustable. By convention, the cyclic ratio corresponds to the ratio between the time where duration of the signal is at "1" to the total time of the signal period. Take as an example a PWM signal generator having an 8-bit program register in which the value "1" is programmed, the digital signal obtained is at "1" for a single base pulse and at "0" during the following 255 base pulses. The digital output of the PWM signal is connected to an RC integrator circuit that smoothes out the periodic signal. A continuous value is thus obtained that can be amplified to control a motor for example.

The applications of PWM signals to control items of equipment requiring an analogue electrical magnitude at input are very numerous. Typically, a motor or the intensity of a lamp, can be regulated, the power of an amplifier can be adjusted, etc. PWM signals are found in television decoders to control the fan speed. In fact, these electronic devices consume a great deal of energy during normal operation. This energy is transformed into heat that is concentrated within devices that are generally sealed. If it is not evacuated this heat provokes an accelerated ageing of electronic components that results in irreversible deterioration. To prevent this, a fan is positioned close to air inlets in the casing of the decoder to accelerate exchanges with the exterior and improve cooling. But using a fan at full speed is noisy. If the device is placed in a room, the sound level can be disturbing. Experimentation has shown that it is not the speed that is audible but rather the variation in speed. When the values are introduced into the PWM generator and a continuous voltage has thus been produced, the progression of one value to a next value is audible, especially when this variation intervenes regularly as is the case for a control system. The characteristics of fans vary from one device to another. As a result the control system must provide the commands in an extensive command range and thus have a high level of precision over the entire range To improve the precision of the control signal, a solution consists in increasing the number of bits of the register that controls the time duration over which the signal is at "1". For example if this is a 12 bit register, the precision goes to 1/4096=0.025%. But a 12 bit PWM generator is more expensive than an 8 bit PWM generator, in addition with the same base frequency the period is 16 times longer, thus it is slower to react.

Another solution consists in varying both the period and the cyclic ratio. To do this, the PWM signal generators are equipped with two control registers, one to program the time duration of the periodic signal, that is to say the period, noted as "PER". The other register programs the time duration, noted as "T_ON" during which the signal is at "1". The cyclic ratio is the result of the ratio T_ON/PER, it is always less than 1 as T_ON is always less than PER. The value of the analogue magnitude generated is directly proportional to the cyclic ratio. For an 8 bit PWM generator, by modifying both the PER and T_ON values a lot more than 256 possible values are obtained, and so, there is a very high number of pairs finally enabling as many different voltage values to be generated.

By respecting the rule: $T\_ON \leqq PER$, the following are obtained:

If PER=255, then 256 values are possible for T_ON.
If PER=254, then 255 values are possible for T_ON.
If PER=253, then 254 values are possible for T_ON.
. . .
If PER=2, then 3 values are possible for T_ON (0, 1 or 2).
If PER=1, then two values are possible for T_ON (0 or 1): the signal is then continuously at "0" or "1".

The null value for PER has no meaning.

The possible number of pairs is the result of an arithmetic progression for which the formula is $\Sigma=255\times((1+255)/2)=32640$ different (T_ON/PER) pairs.

It is noted that some decimal values obtained carrying out the ratio T_ON/PER are identical, for example: 1/2=2/4=4/8=8/16=16/32=32/64=64/128. The calculation demonstrates that there are 19947 pairs (T_ON, PER) producing different decimal values that generate as many different analogue levels. These 19947 decimal values are comprised between 0 and 1 and it can be assumed that any decimal value will be produced with a minimal precision of 1/19947. Unfortunately, the precisions vary considerably from one value to another.

In fact, in organizing the 19947 decimal values generated by all the pairs (T_ON, PER) in a list of increasing values, it is noted that the differences between two consecutive values vary considerably. In the majority of cases, the differences between the decimal values are of 0.000016, which produces a precision of 1/62000 approximately but in a certain zone of the list, the difference sharply increases and can rise to 0.001961, which lowers the precision to 1/510. When there is a wish to produce a regular variation of analogue values, such a difference causes a linearity default. This sharp rise in difference between two cyclic ratios is due to the fact that the ratios T_ON/PER provide discrete decimal values that do not offer the same difference between each other.

The document US 2005/110668—CHIN DOUGLAS describes a way of improving the precision of a DAC. A determined voltage Vd is generated at the input of the PWM. The PWM generator provides a signal having two levels: 0 volt and Vd according to a variable cyclic ratio. The signal provided by the PWM is then filtered to generate a continuous voltage that depends on the value Vd and the cyclic ratio of the PWM, which enables a fine adjustment of the output voltage. This document only considers certain period and cyclic ratio values generating a high degree of imprecision and it would be best not to use them.

The document U.S. Pat. No. 6,593,864—REILLY Timothy describes a PWM generator for which the signal is integrated to provide an analogue voltage. A compensation circuit enables the drift due to the temperature over time to be reduced. The voltage at the output of the integrator is compared to a reference value, and if the difference is great, a state is applied at the Up/Down input of a counter to modify the parameters of the PWM (ref. 22) in such a way as to retain the same level of analogue output over time. This document only considers certain period and cyclic ratio values generating a high degree of imprecision and it would be best not to use them.

The document EP 1 575 171—PATRA PATENT describes a PWM generator that is modulated by an electronic circuit generating a wave form that is cyclic and synchronised with the period of the PWM. This electronic circuit adds a modulation to the PWM signal, that enables the precision to be improved overall. This document only considers certain period and cyclic ratio values generating a high degree of imprecision and it would be best not to use them.

The present invention thus enables the effect of non-linearity due to the fact that some period and cyclic ratio values generate imprecision to be reduced and thus is able to produce from a PWM signal analogue values with a high level of precision.

One of the purposes of the present invention is a method for generating an analogue signal generated from a PWM signal having a first period value and a first cyclic ratio value associated with a command value, said PWM signal being electrically integrated to produce the analogue signal, characterized in that it comprises an application step of a second period value and a second cyclic ratio value producing a PWM signal for which the electrically integrated signal is shifted by a predetermined amplitude, and an activation step of an analogue device generating a shift of the analogue signal generated from the PWM signal, the amplitude of the shift of the analogue signal produced from the PWM signal being identical and in the opposite direction to that produced by the application of second period and cyclic ratio values.

In this way, if the command value cannot correspond precisely to a given cyclic ratio and period pair, then by carrying out a shift in the values of pairs to find a pair of second cyclic ratio and period values generating a given amplitude and by commanding an analogue shift of the same amplitude and in the opposite direction, the precise expected command value is obtained.

According to a first improvement, the application step of second period and cyclic ratio values, and the activation step of an analogue device generating a shift are executed when the difference between the value of the electrically integrated signal and the theoretical value obtained from the command value is greater than a threshold value. In this way, it is possible to set parameters for the triggering of the shift.

According to an improvement, the user can introduce a threshold value to compare with the difference in order to determine if it is necessary to command a shift. This adds more flexibility and enables too numerous shifts to be avoided if the desired precision is average. According to another improvement, the decision to execute the two mutually compensating shifts is determined in advance for all the command values. Advantageously, the decision is presented in the form of an indicator registered for each command value to be applied. In this way, the decision to command a shift is immediately taken.

According to another improvement, the executions of the application step of second period and cyclic ratio values and of the activation step of an analogue device generating a shift of the analogue signal are shifted in time. In this way, the slowest shift means starts first so that the other means will rapidly compensate the difference without it generating too great an artefact. According to this improvement, the activation step of the analogue device generating a shift of the analogue signal is executed at the end of the first period during which the second period and cyclic ratio values are applied. In this way, the first PWM period is already programmed and starts to produce a shift when the shift of the analogue signal occurs a little later but as it is more rapid, the effects will mutually and dynamically be reduced.

According to another improvement, if the analogue device generating a shift of the analogue signal immediately applies the amplitude, then consecutively at the activation step of the analogue device generating a shift of the analogue signal, the first period and cyclic ratio values applied are increased to take into account the delay in establishment due to the integration of the PWM signal, in such a way to limit the sharp difference generated by the analogue shift In this way, it is possible to compensate for the artefacts generated during the activation of the analogue device that has an immediate effect while the analogue signal produced by the second period and cyclic ratio values is slower to establish due to the time constant of the integrator circuit.

According to another improvement, the PWM signal generation device has a circuit for selecting the value of the shift of the analogue signal from among a plurality of predetermined values. In this way, several analogue shift values can be obtained and thus a better precision. According to another improvement, a self-learning device enables the value of the shift of the analogue signal to be calculated so that this value is identical to that produced by the application of other period and cyclic ratio values producing a PWM signal for which the electrically integrated signal is shifted. In this way, it is possible to calibrate from an autonomous functioning of the device and thus improve the intrinsic precision of each device.

Another purpose of the present invention is a device for generating an analogue signal generated from a PWM signal characterized by a first period value and a first cyclic ratio value associated with a command value, comprising an integration means of the PWM signal to produce an analogue signal, characterized in that it comprises a means for generating second period and cyclic ratio values to produce another PWM signal for which the electrically integrated signal is shifted by a predetermined amplitude, and means for shifting a signal generated from the PWM signal and electrically integrated producing a shift for which the amplitude is identical and in the opposite direction to that produced by the means of generation of second period and cyclic ratio values.

Figure 1:
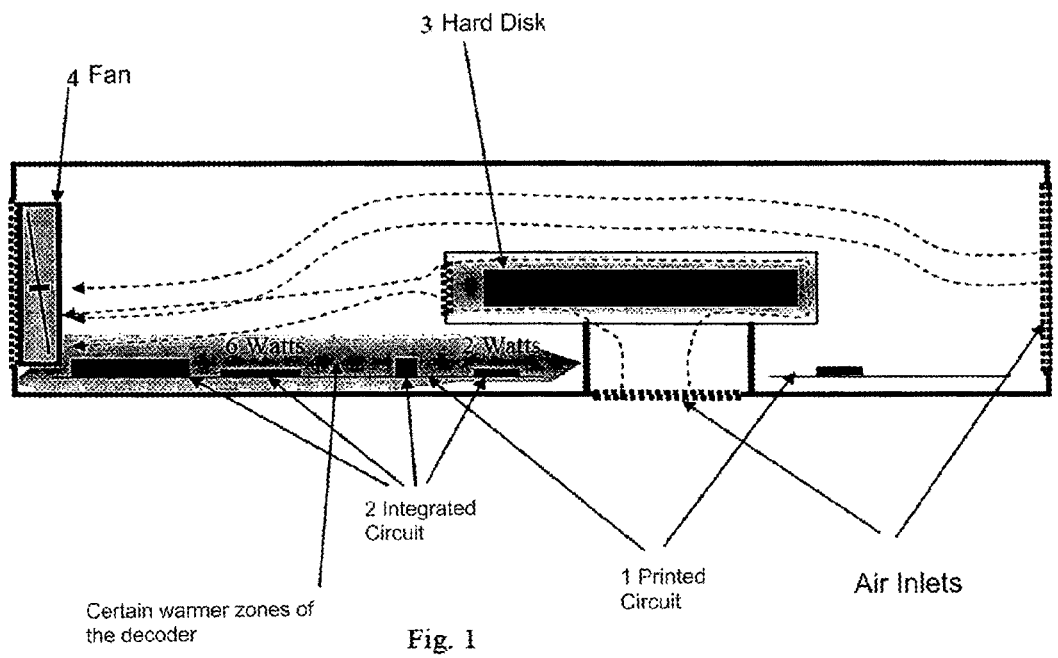

Other characteristics and advantages of the present invention will emerge from the description of the following embodiments to be taken as non-restrictive examples, made with reference to the annexed figures wherein:

FIG. 1 shows a section of an electronic device according to an embodiment of the invention, FIG. 2 illustrates a generation system of a variable analogue signal according to a preferred embodiment.

Figure 6:
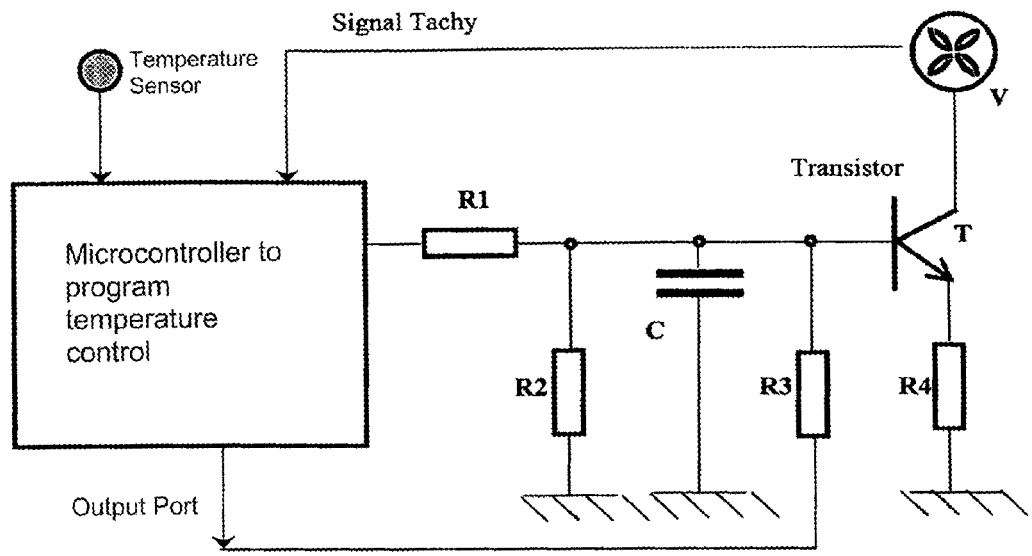
Figure 7:
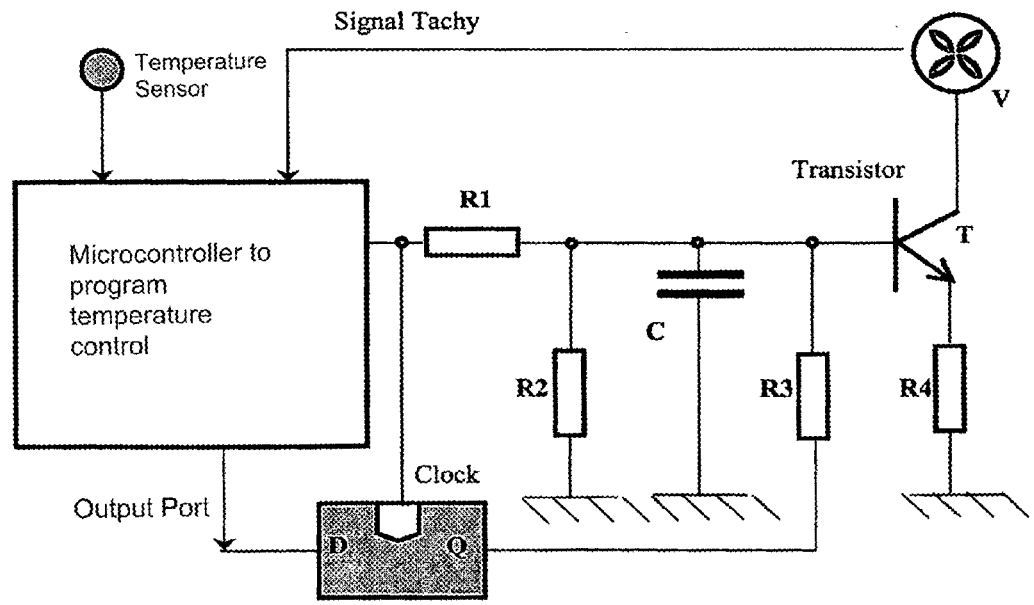

FIG. 3 presents an example of a correspondence table enabling extraction of period and cyclic ratio pairs in order to generate a variable analogue signal, FIG. 4 presents a curve of levels of imprecision of command hexadecimal values ranging from 0000 to 65536 in decimal, FIG. 5 presents a flowchart of steps enabling a precise analogue signal to be provided, according to an embodiment FIG. 6 shows an example of an electronic schema enabling an analogue shift applied to a signal produced by a PWM signal generator to be implemented, FIG. 7 shows an example of an electronic schema where the analogue shift is carried out while synchronizing with the digital shift application.

FIG. 1 describes a section of an electronic device, a television decoder for example. The device comprises a printed circuit 1 on which the electronic circuits 2 are arranged. A hard disk 3 enables recording of data, particularly of lengthy audiovisual works. The circuits 2 and the hard disk 3 consume a large amount of energy and release heat. For example, the CPU of the decoder 2 typically releases approximately 6 watts of energy. As a result, certain zones of the decoder, marked in grey on the FIG. 1, are warmer than others. A fan 4 extracts hot air from within the decoder. Two ventilation air-inlets 5 cut into the decoder casing enable two cool air inlets. Curved arrows show the path of the air flows. The number, the position and the size of the air-inlets are important elements of good ventilation, these parameters being well known to those skilled in the art.

FIG. 2 illustrates a generation device D of an analogue signal enabling control of the speed of the fan V according to a preferred embodiment of the invention. This figure is applicable to all generation systems of an analogue signal that receives a digital value at the input and supplies a PWM signal at the output. In the embodiment described, the management unit M is one of the circuits 2 of the board or part of a circuit 2, its function is to maintain the speed of the fan as close as possible to a set speed. The management unit M has a digital input to receive signals representative of the fan speed (these signals are generally called "Tachy") and a command output to control the fan 4 or V on FIG. 2. The Tachy signal is a pulse signal, the number of pulses per unit of time determines the real speed of the fan. According to the Tachy signal, the management unit 6 calculates the fan speed V and enables any corrections to maintain the speed as close as possible to the value of the set speed.

The generation device D generates a PWM signal to control the speed of the fan. The digital signal is converted into an analogue signal using an integration means, typically a low pass filter constituted of a resistor R and a capacitor C. Then the analogue signal is amplified, using a transistor or an amplification circuit A. The analogue voltage applied may vary between 0 and 12 volts, but generally the fan does not turn for a voltage less than approximately 5 volts, and it becomes too noisy if 9 volts are exceeded. As a result, the useful range of command values of the motor varies between 41% and 75%, which confirms the necessity of having a good level of precision within this quite narrow range. In the context of the invention, the time duration of the periodic signal PER and the time duration during which the signal is at "1" T_ON can be programmed.

According to a first simple embodiment, the analogue signal generation system calculates command values on 16 bits to control the fan. The generation system has a correspondence table recorded in the memory that, for each command hexadecimal value provides a pair (T_ON, PER) able to produce this command value. This table of 65536 values is an ordered list of pairs (T_ON, PER). As previously stated, 19947 different values of cyclic ratios are possible, as a result, some pair values can be associated with a same command value.

The table of FIG. 3 is an example of a correspondence table. Suppose that the analogue signal generation system calculates a command value 8096H (32918 in decimal), the table provides the values PER=219 and T_ON=110, the system programs the two registers of the PWM with these values. It is also possible to reduce the table so that the number of input values is a number equal to a lower power of 2 than 16, for example 2 to the power of 14 or 2 to the power of 12. Some pairs (T_ON, PER) will then disappear as the associated decimal values are very close to other values that remain in the table. The memory zone occupied by the table is thus optimized.

Most microcontrollers manipulate data on 16 bits, a correspondence table indexed by a value on 16 bits will be retained in the document hereafter. This table thus contains 65536 values.

It will be observed using the table of FIG. 3 that two consecutive command values are generally associated with two different pairs (T_ON, PER). But this is not always the case, for example for the command values: 808BH and 808CH, or: 8090H and 8091H, or even: 80A3H and 80A4, the table only provides a single pair (T_ON, PER). As a result, for one of the two command values, the precision passes from $0.16.10^{-6}$ (=1/65536) to $0.32.10^{-6}$ (=1/32768). For other values, the precision falls considerably, for example around the value 8000H, the following command values and pairs (T_ON, PER) are found:

| Hexa index | PER/T_ON | Decimal value | Precision |
|---|---|---|---|
| 7F7EH | (252, 126) | 0.498023715415 | 16.10-6 |
| 7F7FH-7FBFH | (254, 127) | 0.498039215686 | 16.10-6 to 1961.10-6 |
| 7FC0H-8040H | (255, 128) | 0.500000000000 | 16.10-6 to 1960.10-6 |
| 8041H-8080H | (254, 128) | 0.501960784313 | 16.10-6 |
| 8081H | (252, 127) | 0.501976284584 | 16.10-6 |

The pair (T_ON, PER)=(252, 127) is associated by the table with 126 command values. It can be seen that the precision for some command values is only 1960.10−6=1/510, instead of 1/65536 or 1/32768, that is generally found elsewhere. The zone of command values comprised between 7F7FH and 8080H is a zone of imprecision. Namely nnnnH a command value on 16 bits, the associated pair (T_ON, PER) must produce a cyclic ratio for which the decimal value T_ON/PER is very close to nnnH/10000H. If the difference between the ratios T_ON/PER and nnnnH/10000H is too great, the command value nnnnH associated with the pair (T_ON, PER) is imprecise. It will be seen hereafter, how to evaluate the level of imprecision. The present invention will consist not in extracting from the table a pair (T_ON, PER) corresponding to an imprecise command value but in implementing a digital shift by using another command value that is precise and in applying an analogue shift by modifying a parameter of the amplifier. By ensuring that the two shifts are of the same amplitude but in opposite directions, they will cancel each other out.

The value of the digital shift to apply to the command value is calculated in the following way. First it is of use to specify that the command values associated with an imprecise pair (T_ON, PER) are perfectly determined. FIG. 4 shows the level of imprecision of each command hexadecimal value between 0000 and 10000H. As shown in FIG. 4, the zone of maximal imprecision is situated exactly at the middle of the total range of command values that is to say it is centred around the value 8000H. As it is the range for which the imprecision value is maximal, it serves as a reference for the correction and thus for the determination of the shift. It is noted that the shifts between two command values in the zone of maximal precision are of the order of $16.10^{-6}$ and that the zone of maximal imprecision comprises two values for which the total is $1961.10^{-6}+1960.10^{-6}=3921.10^{-6}$. The value $3921.10^{-6}$ represents the width to the range of maximal imprecision. The number of precise values that can be obtained in this range by implementing the ratio $3921.10^{-6}/16.10^{-6}$=is 245. As a result by implementing a digital shift of 245 command values, we can be sure of avoiding the zone of imprecision and by pointing the table with this new value, a precise command value associated with a pair (T_ON/PER) can be extracted. For greater operating ease, the value of 245 is "rounded-off" to the closest power of 2, that is to say 256. The shift will thus consist in adding 0100H to the command hexadecimal value, in other words in adding a unit to the "Most Significant Byte" of the command hexadecimal value.

The microcontroller M generates a PWM signal whose value is greater by 0100H than the one calculated by the generation device D. To compensate for this shift, an analogue device is implemented to lower this level by as much. The PWM signal generated by the microcontroller is a digital signal with two voltage levels: 0 or 5 volts 0 volts are generated for a command value of 0000 and 5 volts for FFFFH. A shift of 0100H thus leads to a variation of 5/256=0.0195 volts. The analogue shift consists in lowering the analogue level by 19.5 millivolts.

FIG. 5 is a flowchart example showing the operations enabling precise analogue values generated by a PWM signal to be generated. At step 5.1, the generation device D determines a command value. Using this command value, the device searches the pair table for the pair (T_ON; PER) capable of generating the PWM signal that supplies the analogue value closest to the one requested (step 5.2). At the same time, the device reads, in the table, the level of imprecision associated with the command value for which a pair (T_ON; PER) is determined. At step 5.3, the level of imprecision is tested and if this level is below a predetermined threshold, then the pair found is effectively applied in the PWM generator. If the level of imprecision exceeds the threshold, then the generation device D activates a command port of the microcontroller which has the effect of generating a shift of the analogue signal produced by the PWM signal (step 5.4). As a result, the analogue signal will increase by a certain value. The generation device D subtracts, from the command value a quantity equal to the one producing the shift of the analogue signal and obtains a new command value that can address the table with a view to searching for a new pair (T_ON; PER) (step 5.5). Advantageously, the command for generating the analogue shift and the introduction of the new pair (T_ON; PER) generating the digital origin shift is not carried out at the same time, but the order and time interval depend on the time constants of the two shift generation means. In a simple embodiment, the average constants are calculated and the two shifts are applied one after the other by spacing them at a determined period.

According to an improvement, and particularly in the case where a resistive network is used to produce the analogue shift, this shift is instantaneous, which is not the case for generating the analogue signal obtained following the application of the digital shift. Indeed, the correct analogue value is only obtained at the end of a PWM signal generation period. Thus, in this case, the new pair (T_ON; PER) is first applied to the PWM generator, then after a period equal to the period PER of the PWM signal, the analogue shift is applied. In this way, the shifts occur at almost the same time, which considerably limits the presence of artefacts on the analogue signal finally produced.

As noted previously, the shift generated in an analogical manner has the same amplitude as the shift obtained by choosing another pair (T_ON; PER) than the one corresponding to the command value calculated by the generation device. The shifts being in the opposite direction, they cancel each other out and an analogue value corresponding to the command value calculated is obtained. A precise analogue signal is obtained since obtained from a precise command value, whereas the command value initially calculated by the generation device D is not so.

It therefore remains to define at which time a command value is considered to be imprecise, which triggers the use of shifting. As noted previously, the zones of imprecision are perfectly located, such that it can be calculated, in the factory, for each command value nnnnH the difference between the ratio T_ON/PER and nnnnH/10000H. According to a simple embodiment, the correspondence table contains a new column containing the value of the difference. For an 8-bit PWM generator, the smallest difference is $16.10^{-6}$. The analysis of all the differences shows that there is a large command succession having a difference less than $32.10^{-6}$, which is the double of the smallest difference, and guarantees a precision of $1/2^{15}$, which is completely satisfactory. According to a first embodiment, the test carried out in step 5.3 therefore consists in comparing the value of the difference corresponding to the command value with the threshold of $32.10^{-6}$. If the value of the difference is greater than the threshold, then the shifts are triggered. According to an embodiment variation, the generation device D offers the operator the possibility of introducing a threshold value using a keyboard for example.

This implementation embodiment is particularly flexible as an operator can adjust the threshold value and thus increase the threshold by reducing the precision, this in order to limit the use of shifts. Moreover, if the generation device D can determine in advance that the command values will change within a range of variation containing a few imprecise values, it can decide to trigger a shift so as to change the command values within a range only containing precise values. For example, suppose that during a long period, the regulation system D sends, to the fan, command values comprised between 8240H and 8400H thus defining the adjustment range, and that the system observes by analysing the table that a zone of imprecision starts at the value 83D0H. The adjustment system then immediately decides to shift the variation range to prevent frequent shift commands during the adjustment in the range. The shift will therefore be launched for all the variation range even if for the values comprised between 8240H and 83CFH, this would not be necessary.

According to an embodiment variation, the manufacturer of the adjustment device determines in advance the triggering of the shift according to a single imprecision. The new column of the correspondence table thus contains an indicator commanding the shift. This new column contains the value of the bit to apply on the output port controlling the analogue shift, the value of this bit also triggers the digital shift.

FIG. 6 shows an example of an implementation circuit diagram of an integrator amplifier of PWM signals suitable to implement the present invention. The network R1, C constitutes the integrator filter of the PWM signal supplied by the microcontroller M. The resistance bridge constituted by R1 and R2/R3 polarises the transistor T. The resistor R3 is connected to an output digital port of the microcontroller M. The voltage supplied by the output port is either 0 volt, or 5 volts. Without analogue shifting, the level of the port is +Vcc. When a shift is applied, the resistance values R1, R2 and R3 are determined so that the voltage is lowered by 19.5 millivolts by applying 0 volts on the output port. The transistor T amplifies the analogue signal applied to its base to control the speed of the fan.

According to another improvement, the microcontroller has several output ports for commanding analogue shifts having different amplitudes. The status of the "n" output ports is controlled by a new value of "n" bits, each port creating a shift whose amplitude is the double of the one generated by the port controlled by the bit with an immediately lower rank. Starting from FIG. 6, several output ports are used to send a signal to the base of the transistor through a calibrated resistor: R31, R32, R33, etc. (not shown in the figure). The value of each resistor is a function of the voltage shift to be achieved. Once the width of the maximum imprecision range is calculated, the first port that corresponds to the most significant bit must generate a first analogue shift at least equal to the maximum imprecision shift width. The second port that corresponds to the immediately less significant bit generates a second shift less large by half than the first. And so on, experience shows that excellent results are obtained with 3 output ports, and therefore 3 bits which allows seven analogue shift values. In the case where the hexadecimal command value programmed by the generation device D is imprecise, the programming of the output statuses of the ports that generate the analogue shift is carried out according to the width of the imprecision range measured for this command value. The larger the imprecision range, the greater the shift must be to command precise measures from pair (T_ON; PER) associated with a command value.

According to the variant embodiment where the manufacturer of the device defines, in the correspondence table, an indicator commanding the shift, this indicator, the new column contains the value of the bits to apply on the output ports commanding the analogue shift. The amplitude of the digital shift is a function of said value. Advantageously, the manufacturer of the device also has in the new column of the table the value to add to the command value. If the command value of the ports triggering the shift is equal to "0000", then the value to add to cause a digital shift is also "0".

According to another improvement, FIG. 7 shows an example of an implementation circuit diagram of an integrator amplifier of PWM signals suitable to implement the present invention and having a means for synchronizing the two shifts. With respect to FIG. 6, a flip-flop has been added applying on its output Q the logical state present on its input D, the update being carried out on a rising edge of the PWM signal. By convention, the rising edge of the PWM signal terminates the period. During the application of a new command value, the values T_ON and PER are extracted from the table and applied to the PWM generator. Suppose that the application of this new pair (T_ON, PER) requires an analogue shift, the output port is set to 0 volts. The analogue shift will only be made at the end of the period of the PWM, that is during the rising edge. In this way, it is no longer useful to wait for a period equal to the period for applying the analogue shift, the flip-flop will synchronize the application of the two shifts. The variation of the analogue signal caused by the application of the new values T_ON and PER is perfectly compensated for by the generation of the analogue shift and this at the same time. As a result, these two concomitant actions limit the presence of artefacts at the level of the analogue signal finally generated.

According to an implementation embodiment, the generation of PWM signals has a base frequency 20 kHz and the time constant chosen for R1 and C is 1 millisecond. During experiments, an artefact was observed at the time of setting up the shift. This artefact is due to the fact that the analogue shift is applied immediately to the output signal as it results from a resistive network, whereas the digital shift results from a PWM signal by an integrator circuit having a certain time constant. To compensate this artefact as much as possible and according to an improvement of the present invention, the generation device D that knows the time constant of the integrator circuit will apply a pair succession (T_ON, PER) that will compensate for the slight delay generated by the integrator circuit. For example, it is seen that during the passage of the period of one millisecond, the analogue signal at the output of the integrator circuit will reach the determined value. The generation device D will then apply, during the two or three first PWM periods, a value with a large difference with respect to the command value, a difference generating a shift that very rapidly compensates for the one of the analogue shift. Then during following periods, the generation device applies the command value extracted from the table.

According to another improvement, the generation device D comprises a self-calibration device enabling the analogue shift value produced by the analogue shift device to be evaluated accurately. Initially, the microcontroller selects a first command value in a precise zone and applies the pair (T_ON; PER) extracted from the table and the analogue shift by activating an output port. Using the tachymetric probe, the microcontroller measures the speed with an accuracy of at least 5 decimal points. Then, the microcontroller deletes the analogue shift and the speed of the fan decreases. Next, the microcontroller extracts from the table the command values immediately greater than the first and measures the speed with the same precision. The microcontroller applies new command values as long as the measured speed is not equal to or extremely close to the first command value. When this second command value is determined, the microcontroller calculates the difference with the first value, this difference corresponds to the digital shift equivalent to the analogue shift.

This operation is carried out for each output port generating a shift such that the absolute values of the digital and analogue shifts are as close as possible. Advantageously, a variable resistor or any other manual means for adjusting the shift is implemented in the device. A visual indication enables the operator to adjust the component so that the analogue shift is equal to a determined value. If several output port are implemented to generate different shifts, this operation is reiterated for each port.

Those skilled in the art can adapt the present invention into many other specific forms without moving away from the application domain of the invention as claimed. In particular, the generation system can be adapted for the generation of signals of all physical sizes used in any electronic device. Consequently, the present embodiments must be considered as being examples but can be modified in the domain defined by the scope of the attached claims.

The invention claimed is:

1. A method for generating an analogue signal generated from a PWM signal having a first period value and a first cyclic ratio value associated with a command value, said PWM signal being electrically integrated to produce the analogue signal, wherein the method comprises:
  applying a second period value and a second cyclic ratio value producing a PWM signal for which the electrically integrated signal is shifted by a predetermined amplitude, and
  activating an analogue device generating a shift of the analogue signal generated from the PWM signal, the amplitude of the shift of the analogue signal produced from the PWM signal being identical and in the opposite direction to that produced by the application of second period and cyclic ratio values.

2. The method for generating an analogue signal according to claim 1, wherein the applying the second period and cyclic ratio values, and the activating the analogue device generating a shift are executed when the difference between the value of the electrically integrated signal and the theoretical value obtained from the command value is greater than a threshold value.

3. The method for generating an analogue signal according to claim 2, wherein the method comprises introducing the threshold value to be compared with the difference.

4. The method for generating an analogue signal according to claim 1, wherein the decision to execute the two mutually compensating shifts is determined in advance for all the command values.

5. The method for generating an analogue signal according to claim 1, wherein the execution of the applying the second period and cyclic ratio values, and the execution of the activating the analogue device generating a shift of the analogue signal are shifted in time.

6. The method for generating an analogue signal according to claim 5, wherein the activating the analogue device generating a shift of the analogue signal is executed at the end of the first period during which the second period and cyclic ratio values are applied.

7. The method for generating an analogue signal according to claim 1, wherein, if the analogue device generating a shift of the analogue signal immediately applies the predetermined amplitude, then consecutively at the activating the analogue device generating a shift of the analogue signal, the first period and cyclic ratio values applied are increased to take into account the delay in establishing the analogue signal due to its integration, in such a way as to limit the sharp difference generated by the analogue shift.

8. The method for generating an analogue signal according to claim 1, wherein the method comprises selecting the value of the shift of the analogue signal from among a plurality of predetermined values.

9. The method for generating an analogue signal according to claim 1, wherein the method comprises calculating the value of the shift of the analogue signal so that this value is identical to the one produced by the applying the second period and cyclic ratio values producing a PWM signal for which the electrically integrated signal is shifted.

10. A device for generating an analogue signal from a PWM signal characterized by a first period value and a first cyclic ratio value associated with a command value, comprising:

an integration circuit of the PWM signal to produce an analogue signal, wherein the integration circuit comprises:

a generation circuit of second period and cyclic ratio values to produce another PWM signal whose electrically integrated signal is shifted from a predetermined amplitude, and a circuit of shifting the signal generated from the PWM signal and electrically integrated producing a shift whose amplitude is identical and in the opposite direction to the one produced by the generation circuit of second period and cyclic ratio values.

11. The device for generating an analogue signal according to claim 10, wherein the generation circuit of second period and cyclic ratio values and the circuit of shifting the analogue signal generated from the PWM signal are activated when the difference between the value of the electrically integrated signal and the theoretical value obtained from the command value is greater than a threshold value.

12. The device for generating an analogue signal according to claim 11, wherein the device comprises an input device for introducing the threshold value to be compared with the difference.

13. The device for generating an analogue signal according to claim 10, wherein the activation of the generation circuit of second period and cyclic ratio values and the activation of the circuit of shifting the analogue signal generated from the PWM signal are shifted in time.

14. The device for generating an analogue signal according to claim 13, wherein the activation of the circuit of shifting the analogue signal generated from the PWM signal is carried out at the end of the first period during which the second period and cyclic ratio values are applied.

15. The device for generating an analogue signal according to claim 10, wherein the device comprises a selection circuit for selecting the value of the shift of the analogue signal from among a plurality of predetermined values.

16. The device for generating an analogue signal according to claim 10, wherein the device comprises a self-learning circuit for calculating the value of the shift of the analogue signal so that this value is identical to the one produced by the application of the second period and cyclic ratio values producing a PWM signal for which the electrically integrated signal is shifted.

* * * * *